United States Patent
Lin et al.

(10) Patent No.: US 7,612,389 B2
(45) Date of Patent: Nov. 3, 2009

(54) EMBEDDED SIGE STRESSOR WITH TENSILE STRAIN FOR NMOS CURRENT ENHANCEMENT

(75) Inventors: Li-Te S. Lin, Hsinchu (TW); Chih-Chien Chang, Yuan-Li Township (TW); Tze-Liang Lee, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 38 days.

(21) Appl. No.: 11/227,592

(22) Filed: Sep. 15, 2005

(65) Prior Publication Data

US 2007/0057287 A1     Mar. 15, 2007

(51) Int. Cl.
H01L 29/78 (2006.01)
(52) U.S. Cl. ............... 257/190; 257/E29.277
(58) Field of Classification Search .......... 257/190, 257/192, E29.277
See application file for complete search history.

(56) References Cited

U.S. PATENT DOCUMENTS

| | | | |
|---|---|---|---|
| 4,728,619 | A | 3/1988 | Pfiester et al. |
| 6,051,458 | A | 4/2000 | Liang et al. |
| 6,649,538 | B1 | 11/2003 | Cheng et al. |
| 6,703,271 | B2 | 3/2004 | Yeo et al. |
| 6,806,151 | B2 | 10/2004 | Wasshuber et al. |
| 6,921,913 | B2 | 7/2005 | Yeo et al. |
| 7,118,952 | B2 * | 10/2006 | Chen et al. ............ 438/199 |
| 7,166,528 | B2 * | 1/2007 | Kim et al. ............. 438/607 |
| 2004/0087075 | A1 | 5/2004 | Wang et al. |
| 2004/0115878 | A1 | 6/2004 | Lee et al. |
| 2004/0157399 | A1 | 8/2004 | Lee et al. |
| 2005/0035409 | A1 * | 2/2005 | Ko et al. ............ 257/350 |
| 2005/0093021 | A1 * | 5/2005 | Ouyang et al. ........ 257/194 |
| 2006/0189053 | A1 * | 8/2006 | Wang et al. .......... 438/197 |
| 2006/0267106 | A1 * | 11/2006 | Chao et al. .......... 257/382 |

OTHER PUBLICATIONS

Bedell, S.W., et al., "300 mm SGOI/Strained-Si for High-Performance CMOS," 2004 Semiconductor Equipment and Materials International, Semicon West, (2004) 6 pages.

Chidambaram, P.R., et al., "35% Drive Current Improvement from Recessed-SiGe Drain Extensions on 37 nm Gate Length PMOS," 2004 Symposium on VLSI Technology Digest of Technical Papers (2004) pp. 48-49.

Ghani, T., et al., "A 90nm High Volume Manufacturing Logic Technology Featuring Novel 45nm Gate Length Strained Silicon CMOS Transistors," IEDM (2003) pp. 978-980.

Lee, B.H., et al., "Performance Enhancement on Sub-70nm Strained Silicon SOI MOSFETs on Ultra-thin Thermally Mixed Strained Silicon/SiGe on Insulator (TM-SGOI) Substrate with Raised S/D," IEDM (2002) pp. 946-948.

(Continued)

Primary Examiner—Allan R. Wilson
(74) Attorney, Agent, or Firm—Slater & Matsil, L.L.P.

(57) ABSTRACT

MOS devices having localized stressors are provided. Embodiments of the invention comprise a gate electrode formed over a substrate and source/drain regions formed on either side of the gate electrode. The source/drain regions include an embedded stressor and a capping layer on the embedded stressor. Preferably, the embedded stressor has a lattice spacing greater than the substrate lattice spacing. In a preferred embodiment, the substrate is silicon and the embedded stressor is silicon germanium. A method of manufacturing is also provided, wherein strained PMOS and NMOS transistors may be formed simultaneously.

24 Claims, 2 Drawing Sheets

OTHER PUBLICATIONS

Mizuno, T., et al., "High-Performance Strained-SOI CMOS Devices Using Thin Film SiGe-on-Insulator Technology," IEEE Transactions on Electron Devices, vol. 50, No. 4 (Apr. 2003) pp. 988-994.

Shimizu, A., et al., "Local Mechanical-Stress Control (LMC): A New Technique for CMOS-Performance Enhancement," International Electron Devices Meeting (2001) pp. 433-436.

Tezuka, T., et al., "A Novel Fabrication Technique of Ultrathin and Relaxed SiGe Buffer Layers with High Ge Fraction for Sub-100 nm Strained Silicon-on-Insulator MOSFETs," Jpn. J. Appl. Phys., vol. 40 (Apr. 2001) pp. 2866-2874.

* cited by examiner

EMBEDDED SIGE STRESSOR WITH TENSILE STRAIN FOR NMOS CURRENT ENHANCEMENT

TECHNICAL FIELD

This invention relates generally to semiconductor devices, and more specifically to methods and structures for introducing stress into metal oxide semiconductor (MOS) devices in order to improve charge carrier mobility.

BACKGROUND

Size reduction of metal-oxide-semiconductor field-effect transistors (MOSFET) has enabled the continued improvement in speed performance, density, and cost per unit function of integrated circuits. One way to improve transistor performance is through selective application of stress to the transistor channel region. Stress distorts (i. e., strains) the semiconductor crystal lattice, and the distortion, in turn, affects the band alignment and charge transport properties of the semiconductor. By controlling the magnitude and distribution of stress in a finished device, manufacturers can increase carrier mobility and improve device performance. There are several existing approaches of introducing stress in the transistor channel region.

One conventional approach includes forming an epitaxial, strained silicon layer on a relaxed silicon germanium (SiGe) layer. Since the SiGe lattice is larger than Si, the SiGe layer stretches the epi-layer the lateral direction, i.e., the silicon will be under a biaxial tensile stress. Another approach includes growing an epitaxial layer of SiGe within recesses in the source/drain regions. In this case, lattice mismatch creates a uni-axial compressive stress within the channel region.

In still another approach, stress in the channel is introduced after the transistor is formed. In this approach, a high-stress film, such as silicon nitride, is formed over a completed transistor. In this case, the stressor, i.e., the film, is placed above the completed transistor structure. Frequently, the stressor is a tensile layer, which because of the geometry of the structure, induces a uni-axial tensile stress in the channel.

One problem facing CMOS manufacturing is that NMOS and PMOS devices require different types of stress in order to achieve increased carrier mobility. For example, a biaxial, tensile stress from a silicon nitride film increases NMOS performance approximately twofold. However, for a PMOS device, such a stress yields almost no improvement. With a PMOS device, a tensile stress improves performance when it is perpendicular to the channel, but it has nearly the opposite effect when it is parallel to the channel. Therefore, when a biaxial, tensile film is applied to a PMOS device, the two stress effects almost cancel each other out.

Workers in the art are aware of these problems. Therefore, new CMOS manufacturing techniques selectively address PMOS and NMOS devices separately. A NMOS fabrication method includes using tensile films to improve carrier mobility. A PMOS fabrication method includes using substrate structures that apply a compression stress to the channel. One PMOS method includes selective application of a SiGe layer within the source/drain regions. Another method uses modified shallow trench isolation (STI) structures that compress the PMOS channel.

A problem with the prior art is that widely different materials and methods are used for NMOS and PMOS devices. For NMOS devices, a silicon nitride tensile film formed over an essentially completed transistor may be used to improve carrier mobility. For PMOS devices, on the other hand, an embedded SiGe stressor may be formed at a more intermediate fabrication stage. A problem with this approach, however, is that using different materials at different stages of the fabrication process further complicates an already complex process. Therefore, there remains a need for improving the carrier mobility of both NMOS and PMOS devices without significantly adding to the cost or complexity of the manufacturing process.

SUMMARY OF THE INVENTION

These and other problems are generally reduced, solved or circumvented, and technical advantages are generally achieved, by embodiments of the present invention, which provides methods and structures for forming strained MOS devices, wherein NMOS and PMOS stressors are formed simultaneously.

In an embodiment of the invention, a metal-oxide-semiconductor field-effect transistor (MOSFET) having localized stressors formed in the source/drain regions is provided. More specifically, embodiments of the invention comprise a gate electrode formed over a substrate, and source/drain regions formed on either side of the gate electrode. Preferably, the source/drain regions include an embedded stressor and a capping layer on the embedded stressor. Preferably, the embedded stressor has a lattice spacing greater than a substrate lattice spacing.

In a preferred embodiment, the substrate is silicon and the embedded stressor is silicon germanium. In other embodiments, the substrate or embedded stressor may comprise materials such as Si, Ge, SiGe, silicon on insulator, silicon germanium on insulator, and combinations thereof. In another embodiment, a top surface of the capping layer is raised above a surface of the substrate. In yet still other embodiments, the embedded stressor is located in a recess in the substrate, and at least a portion of the capping layer is also located in a recess in the substrate.

Yet other embodiments of the invention provide a structure for straining a channel region of a metal oxide semiconductor (MOS) device. Such embodiments comprise a substrate having, a gate electrode formed over the channel region, a recess formed in the source/drain regions, and a first layer formed in the recess. Preferably, the first layer has a lattice spacing greater than the substrate lattice spacing. In an embodiment it is at least 0.2% greater. Embodiments may further comprise a second layer formed on the first layer, wherein the second layer has a lattice spacing less than the first layer lattice spacing. The first and second layers may include materials such as carbon, silicon, germanium, silicon germanium, silicon on insulator, silicon germanium on insulator, and combinations thereof.

Still other embodiments of the invention provide a semiconductor fabrication method. Other embodiments comprise forming a gate electrode on a substrate and forming a recess in the substrate on either side of the gate electrode. Embodiments further comprise forming an embedded stressor layer within the recess and a capping layer on the embedded stressor layer. Preferably, the embedded stressor layer comprises a material having a lattice spacing greater than the substrate lattice spacing. In an embodiment, it is at least 0.2% greater. Preferably, the capping layer and the substrate comprise the same material.

As one skilled in the art recognizes, embodiments of the invention provide solutions for important problems facing semiconductor manufacturing. Conventional methods employ different stressor materials and structures for improving device performance. Unlike conventional methods, preferred embodiments of the invention advantageously use the same stressor material for both PMOS and NMOS devices. A further advantage is that embodiments permit application of the stressor to both PMOS and NMOS devices simultaneously during device manufacture.

It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention. The intermediated stages of manufacturing a preferred embodiment of the present invention are illustrated. Throughout the various views and illustrative embodiments of the present invention.

This invention relates generally to semiconductor device fabrication and more particularly to structures and methods for strained transistors. This invention will now be described with respect to preferred embodiments in a specific context, namely the creation of a MOSFET device. It is believed that embodiments of this invention are particularly advantageous when used in this process. It is believed that embodiments described herein will benefit other applications not specifically mentioned. Therefore, the specific embodiments discussed are merely illustrative of specific ways to make and use the invention, and do not limit the scope of the invention.

Figure 1:
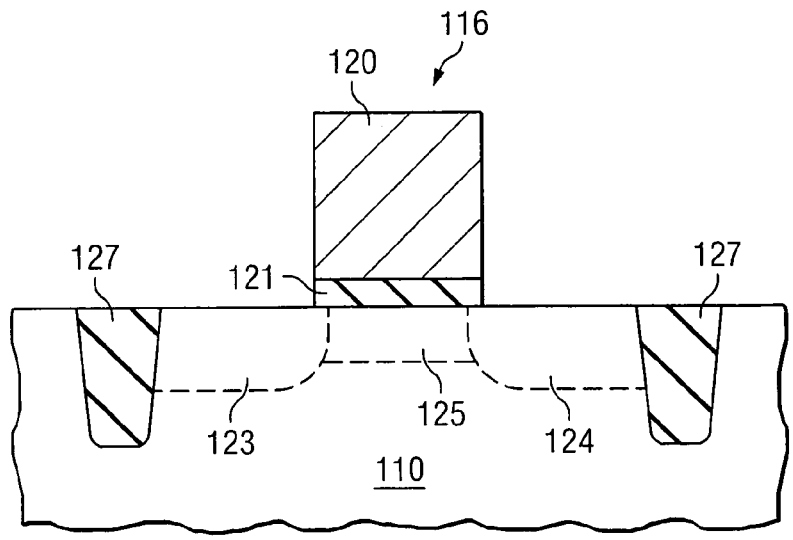
FIG. 1 is a cross-sectional view of an intermediate stage in the manufacture of a MOS device according to embodiments of the invention.

FIG. 1 illustrates a MOS device 116 in an embodiment of the invention. MOS device 116 includes a substrate 110 that includes at least one NMOS or PMOS region, preferably an NMOS region. The NMOS region may be isolated with a shallow trench isolation (STI) region 127. The substrate 110 may comprise bulk silicon, doped or undoped, or an active layer of a silicon on insulator (SOI) substrate. Generally, an SOI substrate comprises a layer of a semiconductor material, such as silicon, or germanium, or silicon germanium (SGOI) formed on an insulator layer. The insulator layer may be, for example, a buried oxide (BOX) layer or a silicon oxide layer. The insulator layer is provided on a substrate, typically a silicon or glass substrate. Other substrates that may be used include multi-layered substrates, gradient substrates, or hybrid orientation substrates.

Continuing with FIG. 1, MOS device 116 includes a source 123 and a drain 124 region. The source/drain regions are implanted using methods known in the art. Each MOS device further includes a gate electrode 120 and a gate dielectric 121. Underlying the gate electrode 120 and the gate dielectric 121 is a carrier channel region 125 connecting the source 123 and drain 124 regions. At this stage of processing, the source 123 and drain 124 regions may include lightly doped extension implants. Because a conventional source/drain implant uses the gate electrode 120 and gate electrode spacers as an implant mask, further source/drain implants may be performed after forming the electrode spacers as described below according to embodiments of the invention.

In alternative embodiments, the channel/substrate orientation may be selected with a view towards optimizing the appropriate charge carrier mobility using SOI or SGOI hybrid orientation substrates. For example, a NMOS channel may be oriented along the <100> direction, which is the direction of maximum electron mobility for a {100} substrate. Alternatively, a PMOS channel may be oriented along the <110> direction, which is the direction where hole mobility is maximum for a {110} substrate.

The gate dielectric 121 may include silicon oxide having a thickness from about 6 to 100 Å, and more preferably less than about 20 Å. In other embodiments, the gate dielectric 121 may include a high-k dielectric having a k-value greater than about 4. Possible high-k dielectrics include $Ta_2O_5$, $TiO_2$, $Al_2O_3$, $ZrO_2$, $HfO_2$, $Y_2O_3$, $L_2O_3$, and their aluminates and silicates. Other suitable high-k gate dielectrics may include hafnium-based materials such as $HfO_2$, $HfSiO_x$, and $HfAlO_x$. In a preferred embodiment in which the gate dielectric 121 comprises an oxide layer, the gate dielectric 121 may be formed by an oxidation process, such as wet or dry thermal oxidation in an ambient comprising an oxide, $H_2O$, NO, or a combination thereof, or by chemical vapor deposition (CVD) techniques using is tetraethylorthosilicate (TEOS) and oxygen as a precursor.

The gate electrode 120 preferably comprises a conductive material such as Ta, Ti, Mo, W, Pt, Al, Hf, Ru, and suicides or nitrides thereof; doped poly-crystalline silicon, other conductive materials, or a combination thereof. In one example, amorphous silicon is deposited and recrystallized to create poly-crystalline silicon (poly-silicon). In the preferred embodiment in which the gate electrode is poly-silicon, the gate electrode 120 may be formed by depositing doped or undoped poly-silicon by low-pressure chemical vapor deposition (LPCVD) to a thickness in the range of about 400 Å to about 2500 Å, but more preferably about 1500 Å.

The gate dielectric 121 and the gate electrode 120 may be patterned by photolithography techniques as is known in the art. Generally, photolithography involves depositing a photoresist material, which is then masked, exposed, and developed. After the photoresist mask is patterned, an etching process may be performed to remove unwanted portions of the gate dielectric material and the gate electrode material to form the gate dielectric 121 and the gate electrode 120 as illustrated in FIG. 1. In the preferred embodiment in which the gate electrode material is poly-crystalline silicon and the gate dielectric material is an oxide, the etching process may be a wet or dry, anisotropic or isotropic, etch process, but preferably is an anisotropic dry etch process.

Figure 2:
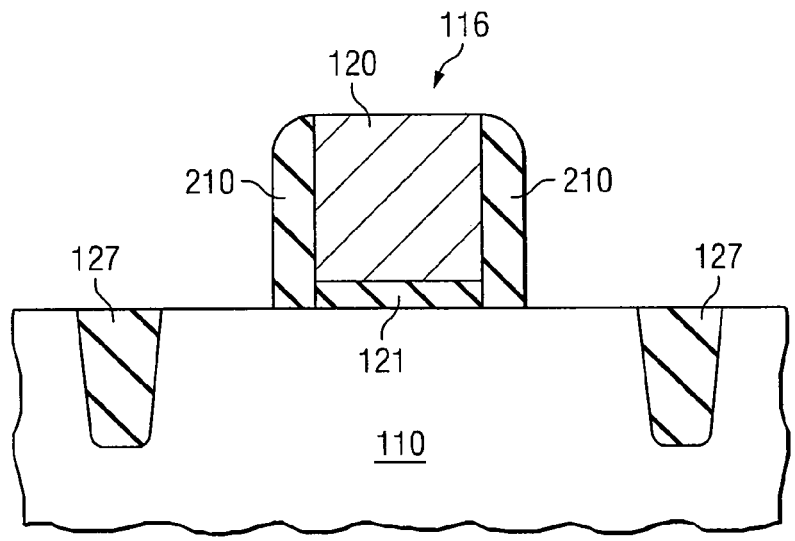
FIGS. 2 and 3 are cross-sectional views illustrating forming a recess in an intermediate MOS device according to embodiments of the invention.

FIG. 2 illustrates the intermediate device 116 of FIG. 1 after a pair of sidewall spacers 210 have been formed on opposite sides of the gate electrode 120 and gate dielectric 121. The sidewall spacers 210, serve as self aligning masks for performing one or more high concentration ion implants within the source/drain regions. The sidewall spacers 210 preferably comprise silicon nitride ($Si_3N_4$), or a nitrogen containing layer other than $Si_3N_4$, such as $Si_xN_y$, silicon oxynitride $SiO_xN_y$, silicon oxime $SiO_xN_y:H_z$, or a combination thereof. In a preferred embodiment, the sidewall spacers 210 are formed from a layer comprising $Si_3N_4$ that has been formed using chemical vapor deposition (CVD) techniques using silane and ammonia as precursor gases.

The sidewall spacers 210 may be patterned by performing an isotropic or anisotropic etch process, such as an isotropic etch process using a solution of phosphoric acid ($H_3PO_4$). Because the thickness of the layer of $Si_3N_4$ is greater in the regions adjacent to the gate electrode 120, the isotropic etch removes the $Si_3N_4$ material on top of the gate electrode 120 and the areas of substrate 110 not immediately adjacent to the gate electrode 120, leaving the spacer 210 as illustrated in FIG. 2. In an embodiment, the sidewall spacers 210 are from about 1 nm to about 100 nm in width.

Figure 3:
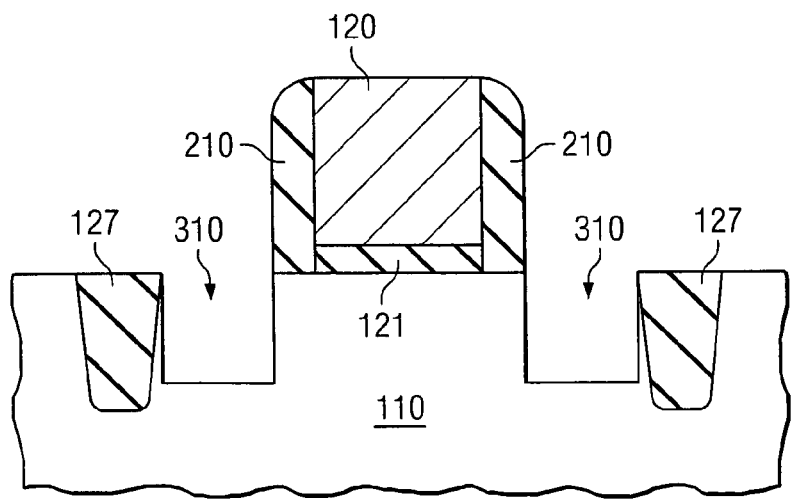

Referring now to FIG. 3, the substrate 110 is shown after an etching process has been performed to create recessed regions 310 in the substrate 110 on either side of the gate electrode 120 within the source/drain regions in accordance with an embodiment of the present invention. The recessed regions 310 may be formed by a plasma etch using fluorine, chlorine, or bromine chemistry. The recessed regions may have a depth between about 10 nm and 200 nm and preferably between about 40 nm and 140 nm. An optional anneal may be performed to facilitate silicon migration to repair any etch damage, as well as to slightly smoothen the silicon surface for the subsequent epitaxy process.

Figure 4:
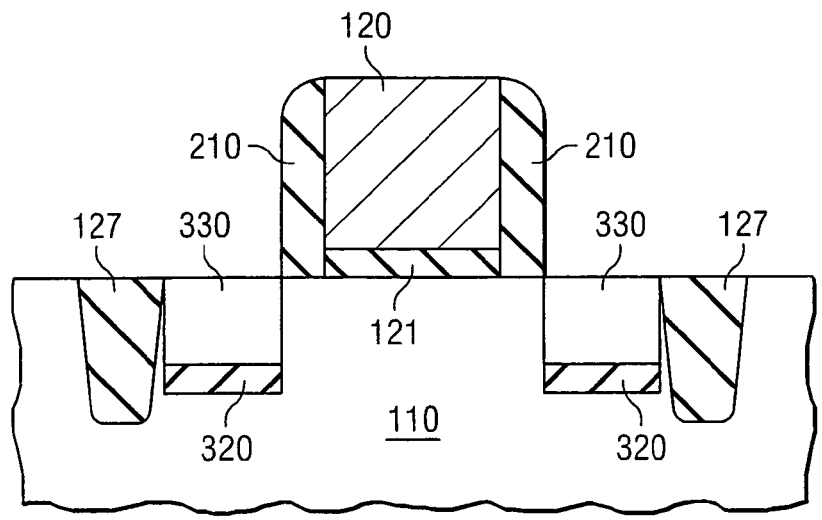
FIGS. 4 and 5 are cross-sectional views illustrating forming an embedded stressor in a MOS device according to embodiments of the invention.

FIG. 4 illustrates the intermediate MOS device of FIG. 3 after an epitaxial growth of an embedded stressor 320 and a capping layer 330, which together, fill the recess of FIG. 3. Applicants found through Raman spectroscopy that the embedded stressor configuration of FIG. 4 advantageously creates a tensile channel stress. In embodiments of the invention, the capping layer 330 and the substrate 110 comprise the same material and therefore have the same lattice spacing. Preferably, the embedded stressor 320 has a lattice spacing greater than the substrate 110. Preferably, the embedded stressor 320 comprises SiGe and the substrate 110 and the capping layer 330 comprise silicon. In alternative embodiments, the capping layer may be comprised of Si, Ge, C, and combinations thereof.

The epitaxy process used to deposit the embedded stressor 320 may include chemical vapor deposition, ultra-high vacuum chemical vapor deposition (UHV-CVD), or molecular beam epitaxy. The capping layer 330, preferably Si or SiC, is formed on the embedded stressor 320, using a selective epitaxy such that silicon fully fills the recess as shown in FIG. 4. The selective epitaxy may include using silane or dichlorosilane and an etching gas, such as, HCl. The selective epitaxy process may be carried out at less than about 900° C., and preferably between about 600 and 800° C.

The epitaxially grown materials may also extend above or below the surface of the substrate 110. For a recess about 80 nm deep, the embedded stressor 320 is preferably about 20 nm to 60 nm thick, and the capping layer 330 preferably at least fills the recess to flush with the substrate surface. Generally, the closer the embedded stressor is to the channel, the stronger the stress effect.

It should be noted that a portion of the embedded stressor 320 and the capping layer 330 may be located underneath a portion of the sidewall spacers 210, dependent upon the desired source/drain implant and electrical characteristics of the resulting source/drain regions. It should also be noted that the process described in FIGS. 1-4 illustrates source/drain regions having SiGe epitaxially grown in recessed regions 310 as an example of a preferred embodiment of the present invention. The processes described in FIGS. 1-4 may be applied to elevated-type source/drain regions. An example of this alternative embodiment is shown in FIG. 5.

Figure 5:
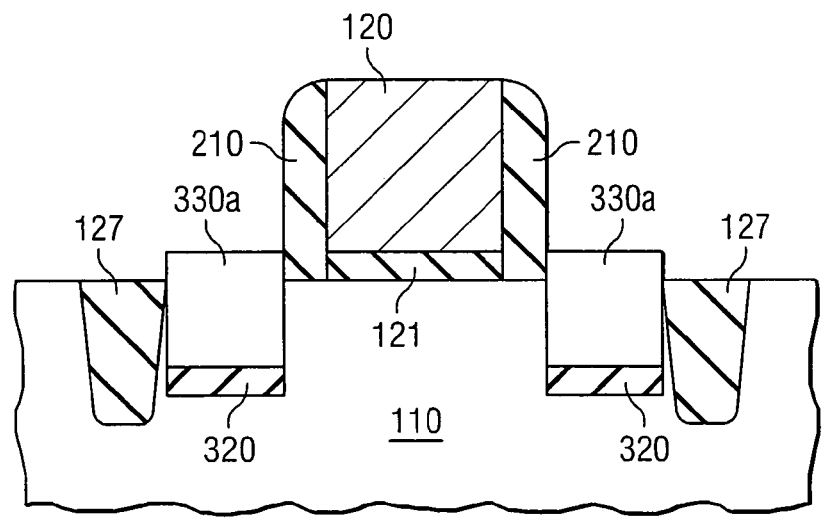

FIG. 5 illustrates an alternate embodiment of the invention wherein the capping layer 330a overlying the embedded stressor 320 is raised above the surface of the substrate 110. In a preferred embodiment, the capping layer 330a is raised above the surface of the substrate by about 30 nm. That is, for recess about 80 nm deep, the capping layer 330a is preferably between about 20 nm and 90 nm thick. In other embodiments, the recess depth is preferably between about 40 nm and 140 nm, and the thickness of the embedded stressor 320 and the capping layer 330a are changed accordingly.

Figure 6:
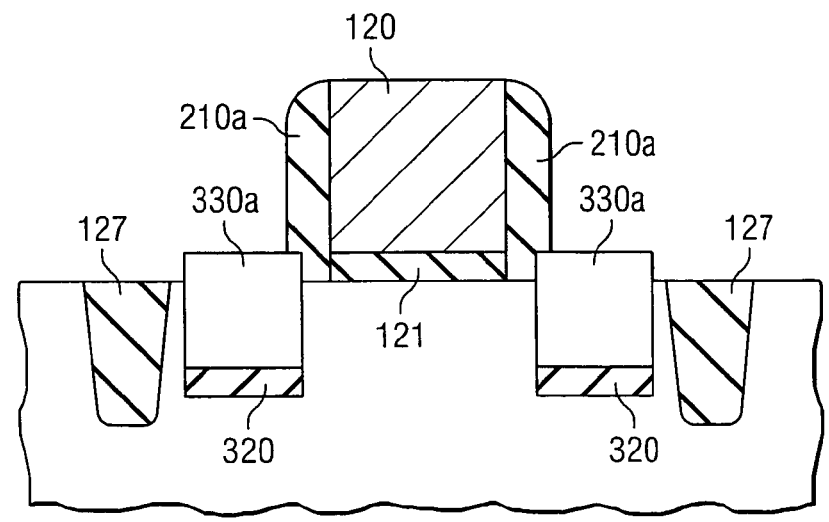
FIG. 6 is a cross-sectional view illustrating forming an embedded stressor according to an alternative embodiment of the invention.

FIG. 6 illustrates an embodiment of the invention wherein the sidewall spacers 210a have an alternate configuration. In this embodiment, the sidewall spacers 210a overlay at least a portion of the capping layer 330a. As further shown in the embodiment of FIG. 6, a portion of the sidewall spacer 210a occupies a recess formed by the capping layer 330a, the surface of the substrate 110, and the sidewalls of the gate dielectric 121 and the gate electrode 120. This sidewall spacer 210a configuration is advantageous because the recess area enables further control of the stress distribution in and around the channel area.

Following the embodiments described above, the intermediate MOS device is completed using conventional semiconductor processing steps as are known in the art. For example, a silicide may be formed by depositing a metal such as titanium or cobalt and then treated to form self-aligned silicide, or salicide, on top of the gate electrode and the source/drain regions and other areas to provide a lower resistance and improve device performance. Following the salicide step, interlevel insulation layers are formed above the substrate using deposition steps to deposit oxide, nitride or other conventional insulation layers, typically silicon dioxide is formed. Contact areas are patterned and etched into the insulators to expose the source, drain and gate electrodes, the resulting vias are filled with conductive material to provide electrical connectivity from metallization layers above the interlevel insulating layers down to the gate electrodes, the source and the drain regions. Metallization layers of aluminum, or copper, may be formed over the interlevel insulation layers using known techniques such as a aluminum metallization process or a dual damascene copper metallization process to provide one, or several, wiring layers that may contact the vias and make electrical connections to the gate electrodes and the source and drain regions.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor device comprising:
   a gate electrode formed over a substrate;
   a pair of sidewall spacers formed on opposite sides of the gate electrode, wherein the sidewall spacers are in contact with at least a portion of a top surface of a capping layer; and
   NMOS source/drain regions formed on either side of the gate electrode,
   wherein the NMOS source/drain regions comprise an embedded stressor and a capping layer on the embedded stressor, wherein the embedded stressor has a lattice spacing greater than a substrate lattice spacing and the capping layer has a lattice spacing less than the substrate lattice spacing.

2. The semiconductor device of claim 1, wherein the substrate is silicon and the embedded stressor is silicon germanium.

3. The semiconductor device of claim 1, wherein the capping layer is silicon carbide.

4. The semiconductor device of claim 1, wherein the substrate comprises a material selected from the group consisting essentially of silicon, germanium, silicon germanium, silicon on insulator, silicon germanium on insulator, and combinations thereof.

5. The semiconductor device of claim 1, wherein a top surface of the capping layer is raised above a surface of the substrate.

6. The semiconductor device of claim 1, wherein the capping layer comprises a material selected from the group consisting essentially of Si, Ge, C, SiC, and combinations thereof.

7. The semiconductor device of claim 1, wherein at least a portion of the capping layer is located in a recess in the substrate.

8. The semiconductor device of claim 1, wherein the lattice spacing of the embedded stressor is at least about 0.2% greater than the substrate lattice spacing.

9. The semiconductor device of claim 1, wherein the embedded stressor is formed within a recess in the substrate between about 10 nm and about 200 nm deep.

10. A structure for straining a channel region of a metal oxide semiconductor (MOS) device comprising:
    a substrate having a substrate lattice spacing;
    a gate electrode formed over the channel region;
    NMOS source/drain regions formed in the substrate oppositely adjacent the gate electrode;
    a recess formed in the NMOS source/drain regions;
    a first layer formed in the recess, wherein the first layer has a lattice spacing greater than the substrate lattice spacing; and
    a second layer formed on the first layer, wherein the second layer has a lattice spacing less than the first layer lattice spacing and wherein the second layer has a lattice spacing less than the substrate lattice spacing; and
    a pair of sidewall spacers formed on opposite sides of the gate electrode, wherein a first portion of the sidewall spacers is in contact with at least a corner of a top surface of the second layer.

11. The structure of claim 10, wherein the substrate is silicon and the first layer is silicon germanium.

12. The structure of claim 10, wherein the substrate comprises a material selected from the group consisting essentially of silicon, germanium, silicon germanium, silicon on insulator, silicon germanium on insulator, and combinations thereof.

13. The structure of claim 10, wherein the first layer comprises a material selected from the group consisting essentially of silicon, germanium, silicon germanium, silicon carbide, and combinations thereof.

14. The structure of claim 10, wherein the second layer comprises a material selected from the group consisting essentially of silicon, germanium, carbon, silicon carbide, and combinations thereof.

15. The structure of claim 10, wherein the second layer is silicon carbide.

16. A semiconductor device comprising:
    a gate electrode formed over substrate;
    NMOS source/drain regions formed on either side of the gate electrode,
    wherein the NMOS source/drain regions comprise an embedded stressor and a capping layer on the embedded stressor, wherein the embedded stressor has a lattice spacing greater than a substrate lattice spacing and the capping layer has a lattice spacing less than the substrate lattice spacing; and
    a pair of sidewall spacers formed on opposite sides of the gate electrode, wherein a portion of the sidewall spacers is in contact with the substrate, and a portion of the sidewall spacers contacts at least a portion of a top surface of the capping layer.

17. The semiconductor device of claim 16, wherein the substrate is silicon and the embedded stressor is silicon germanium.

18. The semiconductor device of claim 16, wherein the capping layer is silicon carbide.

19. The semiconductor device of claim 16, wherein the substrate comprises a material selected from the group consisting essentially of silicon, germanium, silicon germanium, silicon on insulator, silicon germanium on insulator, and combinations thereof.

20. The semiconductor device of claim 16, wherein the top surface of the capping layer is raised above a surface of the substrate.

21. The semiconductor device of claim 16, wherein the capping layer comprises a material selected from the group consisting of Si, Ge, C, SiC, and combinations thereof.

22. The semiconductor device of claim 16, wherein at least a portion of the capping layer is located in a recess in the substrate.

23. The semiconductor device of claim 16, wherein the lattice spacing of the embedded stressor is at least about 0.2% greater than the substrate lattice spacing.

24. The semiconductor device of claim 16, wherein the embedded stressor is formed within a recess in the substrate between about 10 nm and about 200 nm deep.

* * * * *

UNITED STATES PATENT AND TRADEMARK OFFICE
CERTIFICATE OF CORRECTION

PATENT NO. : 7,612,389 B2  
APPLICATION NO. : 11/227592  
DATED : November 3, 2009  
INVENTOR(S) : Lin et al.

Page 1 of 1

It is certified that error appears in the above-identified patent and that said Letters Patent is hereby corrected as shown below:

In Col. 4, line 51, delete "suicides" and insert --silicides--.
In Col. 7, line 38, delete "a" and insert --the--.
In Col. 7, line 63, delete "and".
In Col. 8, line 5, after contact insert --with the substrate, and wherein a second portion of the sidewall spacers is in contact--.
In Col. 8, line 25, after over insert --a--.
In Col. 8, line 54, after consisting insert --essentially--.

Signed and Sealed this

Twenty-second Day of December, 2009

David J. Kappos
*Director of the United States Patent and Trademark Office*